(12) United States Patent
Lin et al.

(10) Patent No.: US 9,612,056 B2
(45) Date of Patent: *Apr. 4, 2017

(54) WAFER HOLDER WITH VARYING SURFACE PROPERTY

(75) Inventors: Yi-Hung Lin, Taipei (TW); Li-Ting Wang, Tainan (TW); Tze-Liang Lee, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 820 days.

This patent is subject to a terminal disclaimer.

(21) Appl. No.: 13/428,749

(22) Filed: Mar. 23, 2012

(65) Prior Publication Data

US 2013/0252189 A1 Sep. 26, 2013

(51) Int. Cl.
*F27D 5/00* (2006.01)
*F27B 17/00* (2006.01)
*H01L 21/67* (2006.01)
*H01L 21/687* (2006.01)

(52) U.S. Cl.
CPC ........ *F27D 5/0037* (2013.01); *F27B 17/0025* (2013.01); *H01L 21/67115* (2013.01); *H01L 21/68757* (2013.01)

(58) Field of Classification Search
CPC ............................ F27D 5/0037; F27B 17/0025
USPC .... 432/1, 253, 247; 219/444.1, 121.85, 405, 219/385; 438/795, 689, 758, 715; 156/345.51
See application file for complete search history.

(56) References Cited

U.S. PATENT DOCUMENTS

| 5,997,175 A * | 12/1999 | Champetier et al. .......... 374/126 |
| 6,090,212 A * | 7/2000 | Mahawili ............ C23C 16/4584 |
| | | 118/500 |
| 2003/0029571 A1* | 2/2003 | Goodman et al. ........ 156/345.51 |
| 2006/0160365 A1* | 7/2006 | Wang .............................. 438/715 |
| 2009/0280248 A1* | 11/2009 | Goodman et al. ........ 427/255.28 |
| 2012/0171510 A1* | 7/2012 | Chiang et al. ................. 428/623 |

OTHER PUBLICATIONS

U.S. Appl. No. 13/426,334, filed Mar. 21, 2012 by inventors Yi-Hung Lin et al. for "Wafer Holder With Tapered Region", 22 pages of text, 6 pages of drawings.

* cited by examiner

Primary Examiner — Phuong Nguyen
(74) Attorney, Agent, or Firm — Haynes and Boone, LLP

(57) ABSTRACT

An apparatus, a system and a method are disclosed. An exemplary apparatus includes a first portion configured to hold an overlying wafer. The first portion includes a central region and an edge region circumscribing the central region. The first portion further including an upper surface and a lower surface. The apparatus further includes a second portion extending beyond an outer radius of the wafer. The second portion including an upper surface and a lower surface. The lower surface of the first portion in the central region has a first reflective characteristic. The lower surface of the first portion in the edge region and the second portion have a second reflective characteristic.

15 Claims, 6 Drawing Sheets

WAFER HOLDER WITH VARYING SURFACE PROPERTY

CROSS-REFERENCE TO RELATED APPLICATION

The present disclosure is related to U.S. patent application Ser. No. 13/426,334, filed Mar. 21, 2012, by inventors Yi-Hung Lin et al., entitled "WAFER HOLDER WITH TAPERED REGION," which is hereby incorporated by reference in its entirety.

BACKGROUND

In some semiconductor manufacturing processes, wafer processing chambers or reactors are used to process wafers from which integrated circuits are made. During the manufacturing process, a wafer is placed on a wafer holder (or susceptor). After the wafer has been placed on the wafer holder, it is placed in a processing chamber or reactor where a process, which has non-steady state temperatures, is performed using backside lamps. The backside lamps may include one or more lamps placed under the wafer holder to heat the wafer holder and the wafer.

For example, a rapid thermal process (RTP), using backside lamps, may be performed to deposit film layers on the wafer. This may be referred to as chemical vapor deposition (CVD). As the CVD process is carried out, the amount of film deposited on the wafer may vary as a function of the temperature of the wafer. The wafer temperature may not be uniform for a variety of reasons. For example, the wafer temperature may not be uniform because the wafer edge transfers heat to the underlying wafer holder, thereby causing a temperature difference between the wafer edge and the wafer center. As such, the uneven wafer temperature results in uneven/varying film deposition that ultimately adversely affects the performance of the integrated circuit made from the wafer. Temperature uniformity can also be important for other non-steady or RTP temperature processing such as annealing, doping, etching, and other processes. Accordingly, there is a need for a wafer holder (susceptor) that more uniformly controls wafer temperature during non-steady state conditions.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
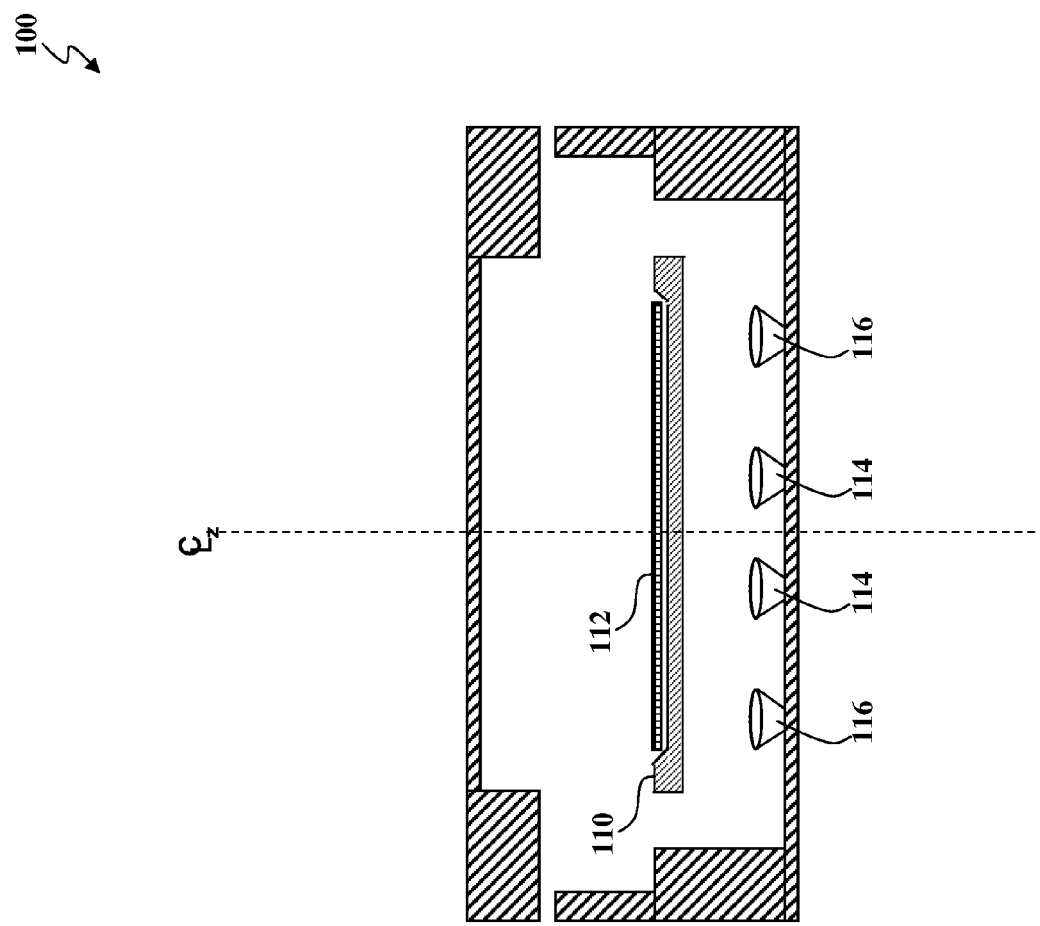
FIG. 1 illustrates a cross-sectional view of one embodiment of a wafer processing chamber within which a wafer holder in accordance to various aspects of the present disclosure can be utilized.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Also, the components disclosed herein may be arranged, combined, or configured in ways different from the exemplary embodiments shown herein without departing from the scope of the present disclosure. It is understood that those skilled in the art will be able to devise various equivalents that, although not explicitly described herein, embody the principles of the present invention.

With reference to FIG. 1, illustrated is a cross-sectional view of one embodiment of a wafer processing chamber 100 within which a wafer holder 110 in accordance to various aspects of the present disclosure can be utilized. The wafer holder 110 is made of quartz. Alternatively, the wafer holder 110 may be made of any other suitable material. The wafer holder 110 holds a wafer 112 which is processed in the wafer processing chamber 100. The wafer 112 is a 300 mm diameter wafer. Alternatively, the wafer 112 is a 450 mm diameter wafer, or any other suitable diameter wafer. As such, the wafer holder 110 may be provided with varying dimensions for processing different size wafers 112. The wafer 112 is held on the wafer holder 110 at a distance such that it is suspended over the wafer holder 112. Alternatively, the wafer 112 is in direct contact with the wafer holder 110. As will be further discussed below, in the present embodiment, the wafer 112 is suspended over the wafer holder 110 by contact pins, each pin having a height of about 1 mm and located about 135 mm radially from the center of the 300 mm wafer 112. Alternatively, the wafer 112 is suspended over the wafer holder 110 by any means appropriate and at any distance according to design requirements. The wafer 112 may include an elementary semiconductor material, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof.

The wafer processing chamber 100 further includes radiant heat elements such as one or more center backside lamps 114 and one or more edge backside lamps 116. The backside lamps 114, 116 may be, for example, halogen lamps, or any suitable radiant heat elements. The backside center/edge lamps 114, 116 may be positioned in a uniform circular formation about the center line (CL) such that the overlying wafer holder 110 and wafer 112 are evenly exposed to the radiant light and thereby heated. It is understood that although in the present illustration only two center/edge lamps 114, 116 are shown, any number of center/edge lamps may be provided. The wafer processing chamber 100 may further include upper lamps, gas delivery mechanisms, pressure control mechanisms, vents, and any other suitable structures and mechanisms in accordance with design requirements.

Still referring to FIG. 1, during operation, for example, a spike heating process may be employed that uses the one or more center backside lamps 114 and the one or more edge backside lamps 116 to expose the wafer 112 to the radiant light through the quartz wafer holder 110 and thereby heat the wafer 112. The spike heating process may heat the wafer 112 from about 20° C. to about 1100° C. in about 0.5 seconds to about 60 seconds and then cooled just as rapidly. During the heating process, however, the wafer 112 may have non uniform temperature as the edge of the wafer 112 tends to be cooler then the center of the wafer 112. Non uniform wafer temperature may result from a number of factors. For example, the chamber design may be such that the distance between the wafer and the backside lamps is not short enough or the backside lamps span is not wide enough to properly/evenly heat the wafer 112, thereby leading to non uniform temperature of the wafer 112 (center to edge). Additionally, during the heating process, the wafer holder 112 may act as a heat sink (due to its mass and lower temperature) and thus absorb thermal energy from the wafer 112 at the outer edges. Notably, wafer temperature non uniformity concerns (cooler edge and hotter center) have been observed even with center backside lamps 114 being turned off. It is understood that although the present example discusses spike heating process, the embodiments of the present disclosure are equally applicable to rapid thermal processes (RTP) and other non-steady state heating process utilizing backside lamps.

Figure 2:
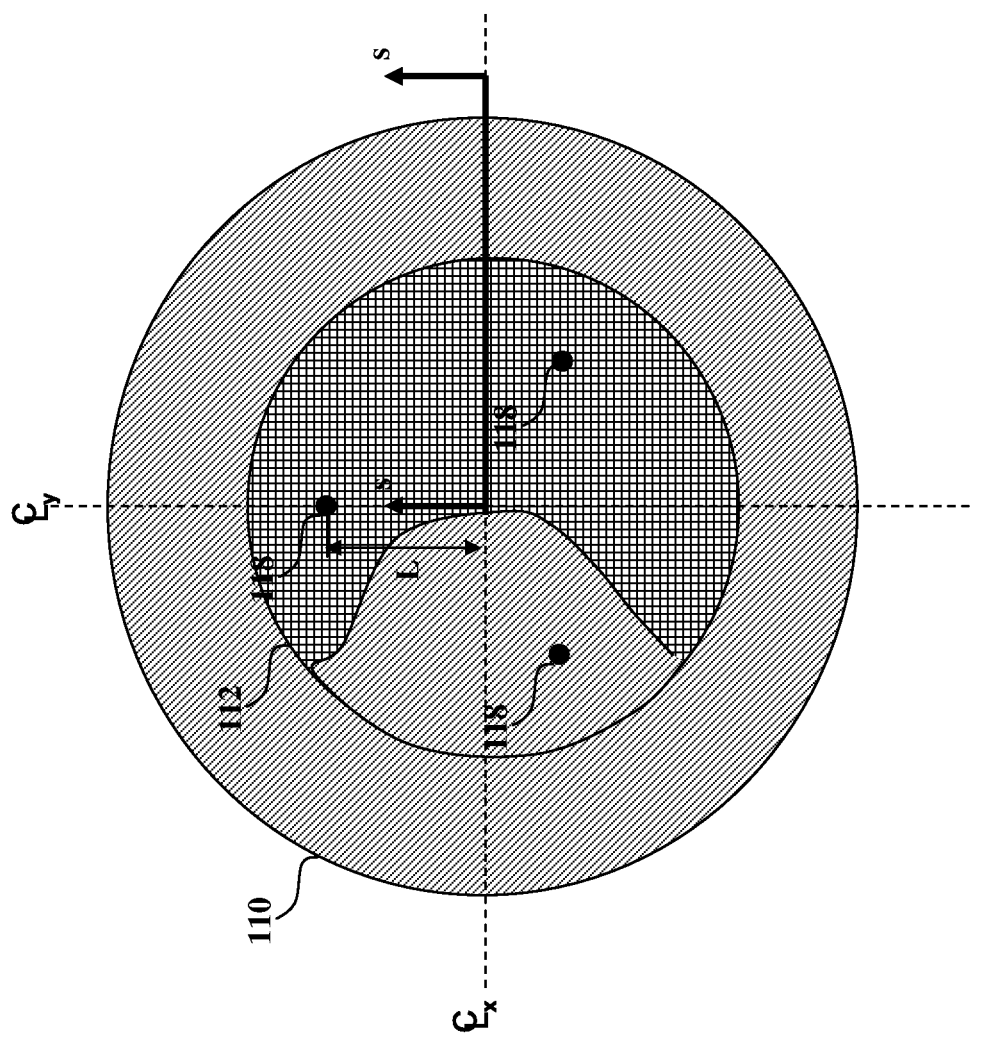
FIG. 2 illustrates a top view of one embodiment of a wafer holder according to various aspects of the present disclosure.

With reference to FIG. 2, illustrated is a top view of one embodiment of the wafer holder 110 and the wafer 112, of FIG. 1, according to various aspects of the present disclosure. As illustrated, the wafer holder 110 extends beyond the area covered by the wafer 112. Thus, the ratio of the surface area of the wafer holder 110 to the wafer 112 may be from about 1:1 to about 4:1. In the present embodiment, the surface area of the wafer holder 110 to the wafer 112 is about 2:1. In the present embodiment, the wafer 112 is suspended over the wafer holder 110 thereby forming an air gap between the two structures. The wafer 112, is suspended over the wafer holder 110 by three contact pins 118. The contact pins 118 may be made of quartz or any suitable material. In the present embodiment, each contact pin 118 has a thickness ranging from about 0.5 mm to about 2 mm (resulting in an air gap ranging from about 0.5 mm to about 2 mm). Each contact pin 118 is located at a distance L, which is about 135 mm radially from the center of the 300 mm wafer 112. As illustrated, each pin 118 is substantially equally spaced apart one from the other. It is understood that the distance L may be any suitable distance such that the wafer is properly supported and that any number of pins, other support structures, or other support mechanisms may be used. It is further understood that the proximity of the wafer 112 to the wafer holder 110 affects heat transfer between the two structures. As such, the distance between the wafer holder 110 and the wafer 112 may be used to tune the heat transfer between the two structures. Accordingly, the thickness of the contact pins 118 may be any suitable thickness, according to design requirements. In alternative embodiments, no contact pins 118 are used and the wafer 112 is placed directly on the wafer holder 110.

Figure 3:
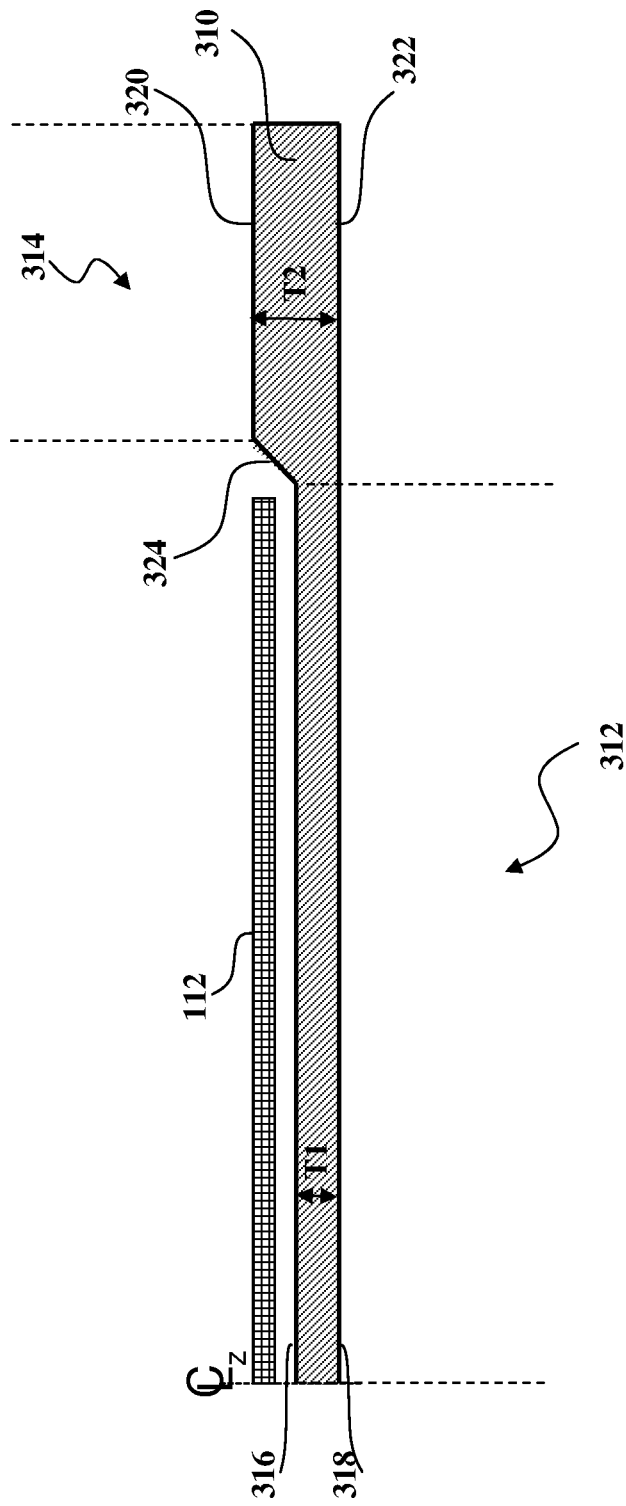
FIG. 3 illustrates a cross-sectional side view of a wafer holder according to various aspects of the present disclosure.
Figure 4:
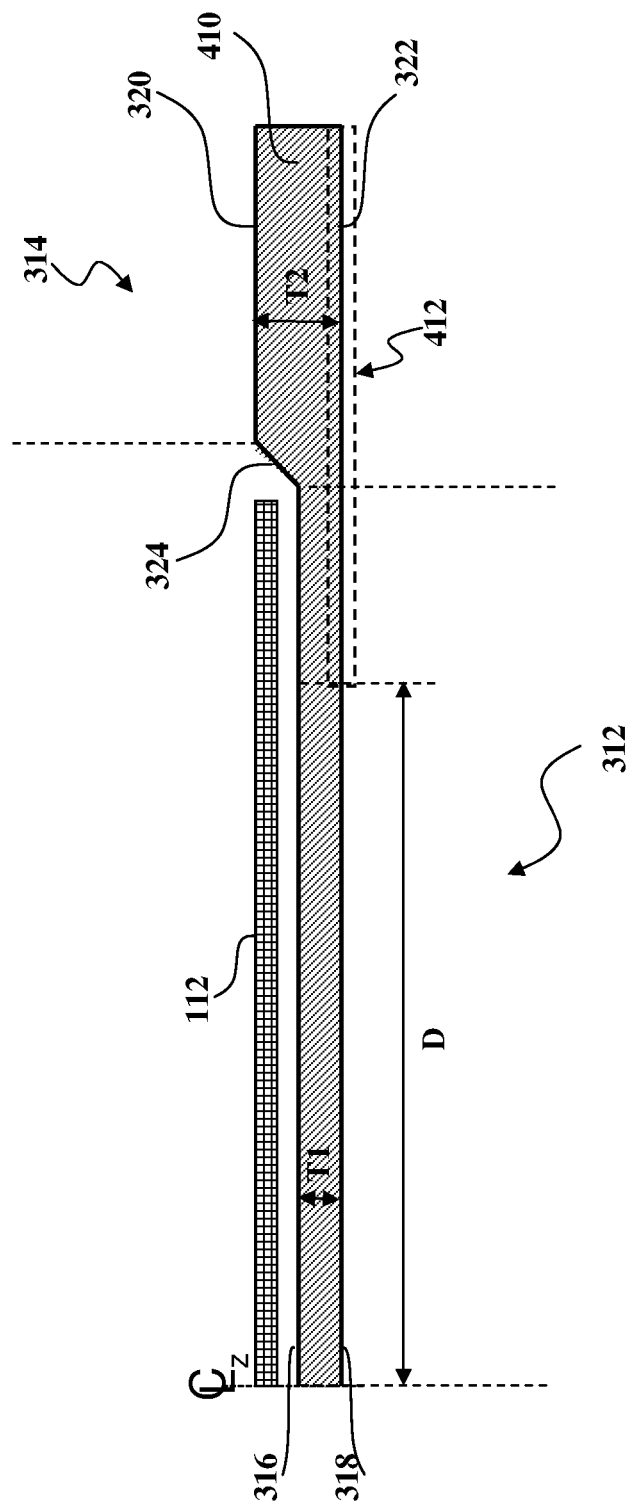
FIG. 4 illustrates a cross-sectional side view of a wafer holder according to various aspects of the present disclosure.
Figure 5:
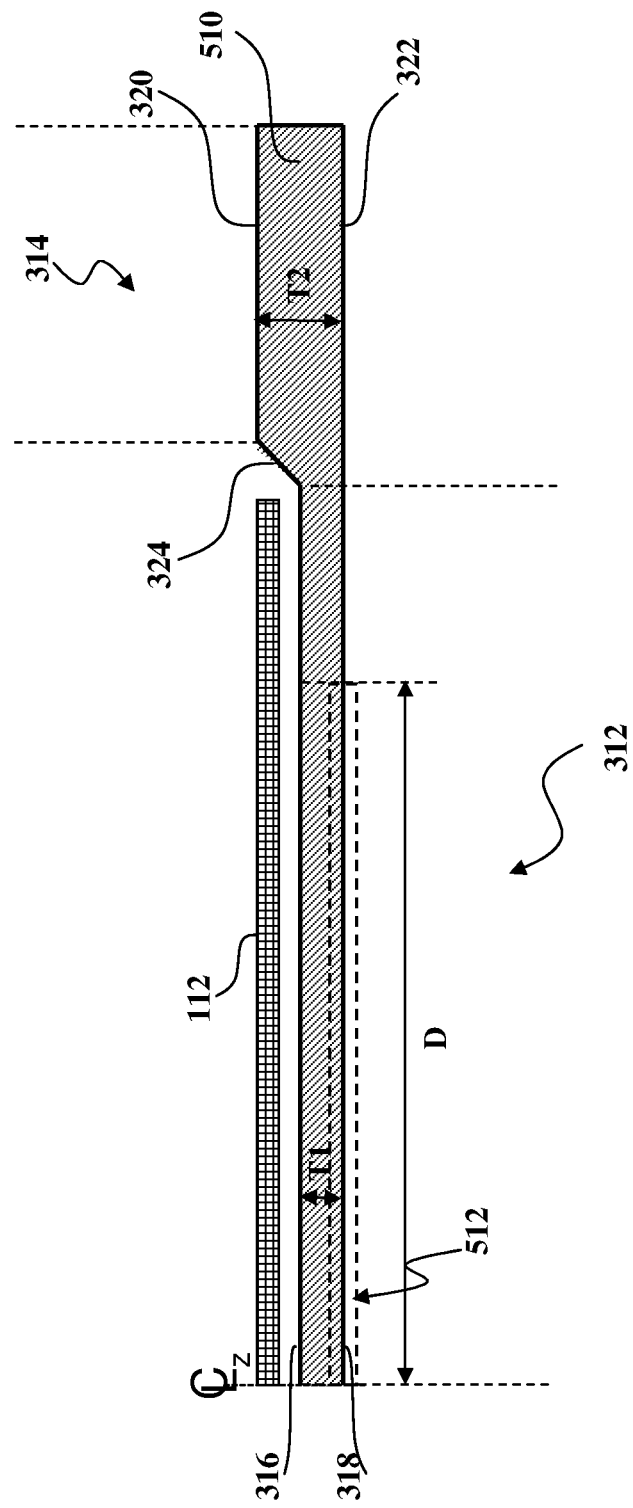
FIG. 5 illustrates a cross-sectional side view of a wafer holder according to various aspects of the present disclosure.

With reference to FIGS. 3-5, illustrated is a cross-sectional side view of wafer holders, taken along lines s-s of FIG. 2, according to various aspects of the present disclosure. The wafer holders 310, 410, and 510, of FIGS. 3-5, respectively, are substantially the same as the wafer holder 110 of FIGS. 1-2, in terms of structure and composition.

Referring to FIG. 3, illustrated is a cross-sectional side view of a wafer holder 310 according to various aspects of the present disclosure. In the illustrated embodiment, the wafer holder 310 includes a contact portion referred to as a first portion 312 that the wafer 112 overlies and an exterior portion referred to as a second portion 314 that extends beyond the wafer 112. The first portion 312 covers a radial distance of at least the radius of the wafer 112. In the illustrated embodiment, the first portion 312 includes an upper surface 316 and a lower surface 318. The lower surface 318 faces the backside lamps (114, 116 of FIG. 1) and the upper surface 316 faces a lower surface of the wafer 112. In the illustrated embodiment, the upper and lower surfaces 316, 318 of the first portion 312 are substantially parallel one with the other and with the lower surface of the wafer 112. The first portion 312 has a first thickness of T1, measured from the upper surface 316 to the lower surface 318. The first thickness T1 of the wafer holder 310 may be any suitable thickness such that the wafer 112 is adequately supported. In the present embodiment, for example, the first thickness T1 is about 2 mm.

Still referring to FIG. 3, the second portion 314 includes an upper surface 320 and a lower surface 322 substantially parallel one with the other. The second portion 314 has a second thickness of T2, measured from the upper surface 320 to the lower surface 322. The second thickness T2 of the wafer holder 310 may be any suitable thickness such that the wafer 112 is adequately supported. In the present embodiment, for example, the second thickness T2 is about 3 mm. At the interface 324 where the first portion 312 and the second portion 314 meet a transition occurs such that the upper surface 316 of the first portion 312 tends toward the upper surface 320 of the second portion 314. It is understood that although in the present embodiment the interface 324 has a single linear profile, one or more linear or nonlinear, or any suitable profile may be used according to design requirements.

The illustrated embodiment of FIG. 3, however, may have temperature uniformity concerns as the close proximity of the wafer holder 310 to the wafer 112 may result in significant heat transfer between the two structures, the lack of sufficient amount of radiant energy from the backside lamps does not sufficiently heat the outer edge of the wafer 112, and/or the radiant energy from the backside lamps provides too much heat to the center of the wafer 112.

Referring to FIG. 4, illustrated is a cross-sectional side view of a wafer holder 410 according to various aspects of the present disclosure. The illustrated embodiment of the wafer holder 410 serves to enable wafer center-to-edge temperature control for backside non-steady state heating process. The wafer holder 410 of FIG. 4 is similar in terms of composition, formation, and configuration to the 310 of FIG. 3. Accordingly, similar features are identified by the same reference numerals for clarity and simplicity.

Still referring to FIG. 4, the wafer holder 410 includes a first portion 312 that the wafer 112 overlies and a second portion 314 that extends beyond the wafer 112. In the illustrated embodiment, the first portion 312 includes an upper surface 316 and a lower surface 318. The lower surface 318 faces the backside lamps (114, 116 of FIG. 1) and the upper surface 316 faces a lower surface of the wafer 112. In the illustrated embodiment, from the center line (CL) to a radial distance D, a center region of the first portion 312 is defined that is substantially transparent such that light energy may reach the lower surface of the wafer 112. The region of the first portion 312 that circumscribes the center region is the edge region. The radial distance D may be a distance from about 70% to about 90% of the total radius of the wafer 112. For example, in the illustrated embodiment, the wafer 112 is a 300 mm wafer having a radius of 150 mm; thus, in the present embodiment, the radial distance D ranges from about 105 mm to about 135 mm. It is understood that for other size wafers the radial distance D will be calculated according to the above criteria and thus have different respective range values.

Still referring to FIG. 4, the second portion 314 includes an upper surface 320 and a lower surface 322 substantially parallel one with the other. The second portion 314 has a second thickness of T2, measured from the upper surface 320 to the lower surface 322. The second thickness T2 of the wafer holder 310 may be any suitable thickness such that the wafer 112 is adequately supported. In the present embodiment, for example, the second thickness T2 is about 3 mm. At the interface 324 where the first portion 312 and the second portion 314 meet a transition occurs such that the upper surface 316 of the first portion 312 tends toward the upper surface 320 of the second portion 314. It is understood that although in the present embodiment the interface 324 has a single linear profile, one or more linear or nonlinear, or any suitable profile may be used according to design requirements.

With further reference to FIG. 4, the wafer holder 410 includes a non-transparent surface 412 (e.g., translucent, opaque). The transparent surface extends from about the radial distance D to about the outer edge of the wafer holder 410. The non-transparent surface 412 spans across the lower surfaces 318, 322 of the first and second portions 312, 314, respectively. The non-transparent surface 412 may be formed by sanding the lower surface 318, 322 or by coating the lower surface 318, 322 with a film. The film may silicon having a reflectance <0.3, or any suitable material. As such, the wafer holder 410 includes a transparent surface in the central region and a non-transparent surface 412 in the edge region. As discussed below, the disclosed surfaces allow for better center-to-edge temperature control.

When comparing the wafer holder 410 of FIG. 4 with the wafer holder 310 of FIG. 3, seen at least is a difference in lower surface non-transparency, illustrated as non-transparent surface 412. The surface difference provides for a reduction in thermal loss between the edge of the wafer 112 and the wafer holder 410. The reduced thermal loss between the two structures results from the fact that during the heating process, the non-transparent surface 412 of the wafer holder 410 absorbs more energy thereby increasing the temperature of the wafer holder 410, resulting in less temperature difference between the edge of the wafer 112 and the wafer holder 410. Because there is less temperature difference between the edge of the wafer holder 410 and the edge of the wafer 112, the wafer holder 410 does not act as a heat sink to absorb energy from the edge of the wafer 112. Accordingly, the illustrated embodiment of FIG. 4 allows for a reduction in heat transfer from the edge of the wafer 112 to the wafer holder 410, thereby providing for a method to uniformly control the temperature of the wafer 112 such that the temperature difference between the wafer 112 center and edge is minimized.

Referring to FIG. 5, illustrated is a cross-sectional side view of a wafer holder 510 according to various aspects of the present disclosure. The illustrated embodiment of the wafer holder 510 serves to enable wafer center-to-edge temperature control for backside non-steady state heating process. The wafer holder 510 of FIG. 5 is similar in terms of composition, formation, and configuration to the 310 of FIG. 3. Accordingly, similar features are identified by the same reference numerals for clarity and simplicity.

Still referring to FIG. 5, the wafer holder 510 includes a first portion 312 that the wafer 112 overlies and a second portion 314 that extends beyond the wafer 112. In the illustrated embodiment, the first portion 312 includes an upper surface 316 and a lower surface 318. The lower surface 318 faces the backside lamps (114, 116 of FIG. 1) and the upper surface 316 faces a lower surface of the wafer 112. In the illustrated embodiment, from the center line (CL) to a radial distance D, a central region of the first portion 312 is defined that includes a reflective surface 512. The reflective surface 512 reflects light energy from the backside lamps (114, 116, of FIG. 1) thereby minimizing light energy to the center of wafer 112. The reflective surface 512 may be formed by opaque quartz coating the lower surface 318 of the wafer holder 510 with a film. The film, for example, may include Heraeus Reflective Coating (HRC) having a reflectance >0.3, or other suitable material. A edge region of the first portion 312 circumscribes the central region. The radial distance D may be a distance from about 70% to about 90% of the total radius of the wafer 112. For example, in the illustrated embodiment, the wafer 112 is a 300 mm wafer having a radius of 150 mm; thus, in the present embodiment, the radial distance D ranges from about 105 mm to about 135 mm. It is understood that for other size wafers the radial distance D will be calculated according to the above criteria and thus have different respective range values.

Still referring to FIG. 5, the second portion 314 includes an upper surface 320 and a lower surface 322 substantially parallel one with the other. The second portion 314 has a second thickness of T2, measured from the upper surface 320 to the lower surface 322. The second thickness T2 of the wafer holder 310 may be any suitable thickness such that the wafer 112 is adequately supported. In the present embodiment, for example, the second thickness T2 is about 3 mm. At the interface 324 where the first portion 312 and the second portion 314 meet a transition occurs such that the upper surface 316 of the first portion 312 tends toward the upper surface 320 of the second portion 314. It is understood that although in the present embodiment the interface 324 has a single linear profile, one or more linear or nonlinear, or any suitable profile may be used according to design requirements.

When comparing the wafer holder 510 of FIG. 5 with the wafer holder 310 of FIG. 3, seen at least is a difference in lower surface reflective characteristics, illustrated as reflective surface 512. The surface difference provides for a reduction in thermal energy that reaches the center of the wafer 112. The reduced thermal energy in the center of the wafer 112 provides for a more uniform center-to-edge temperature of the wafer 112. Accordingly, the illustrated embodiment of FIG. 5 allows for a reduction in thermal energy to the center of the wafer holder 410, thereby providing for a method to uniformly control the temperature of the wafer 112 such that the temperature difference between the wafer 112 center and edge is minimized.

Figure 6:
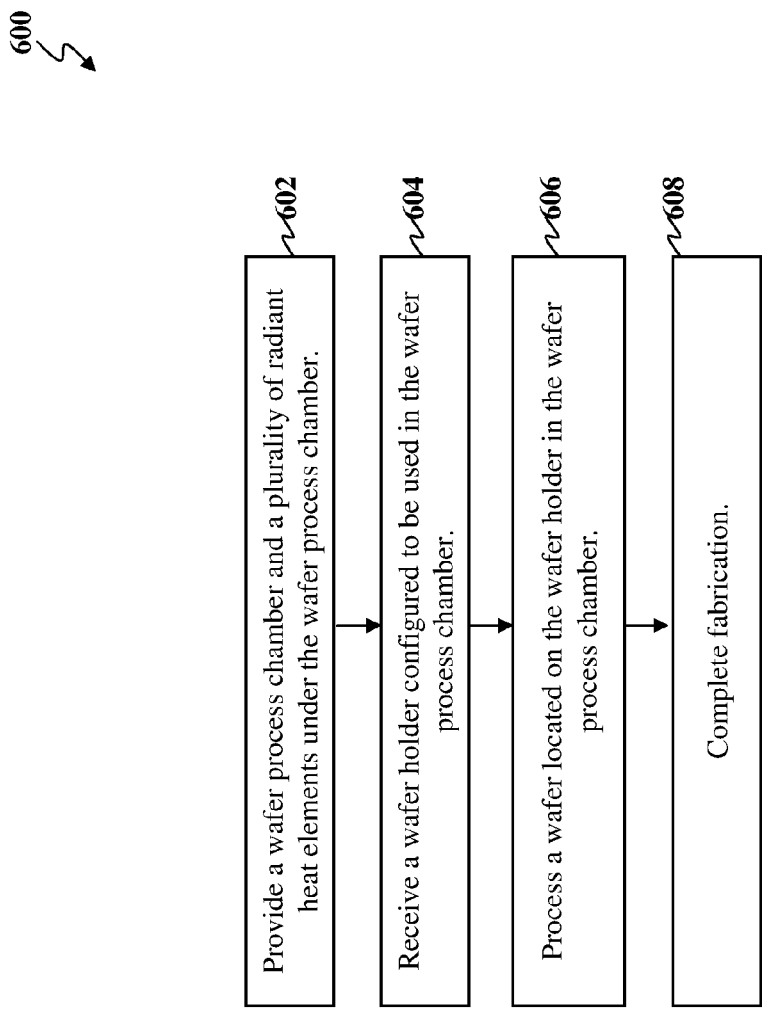
FIG. 6 illustrates a method of utilizing the wafer holders of FIGS. 3 to 5, according to various aspects of the present disclosure.

With reference to FIG. 6, a method 600 of using the wafer holders of FIGS. 3 to 5, according to various aspects of the present disclosure is provided. The method 600 begins at block 602 where a wafer process chamber and a plurality of backside radiant heating elements are provided. The method continues at block 604 where a wafer holder configured to be used in the wafer process chamber is received. The wafer holder is a wafer holder similar to the wafer holders 310, 410, and 510 of FIGS. 3-5. The method 600 continues at block 606 where a wafer located on the wafer holder in the wafer process chamber is processed. The processing may include using the backside heating elements to heat the wafer in the process chamber and perform a process such as chemical vapor deposition, annealing, etching, doping, or any other suitable process. The method 600 continues with block 608 where fabrication is completed. Additional steps can be provided before, during, and after the method 600, and some of the steps described can be replaced or eliminated for other embodiments of the method.

The above embodiments of the wafer holder 301, 410, 510, and method 600 enable wafer center-to-edge temperature control for backside non-steady state heating process such as spike heating processes, RTA heating processes, and other non-steady state heating processes. During non-steady state backside heating, the wafer holders 301, 410, 510, provide for reduced heat transfer from the edge of the wafer to the wafer holder and for reduced amount of radiant energy to reach the center of the wafer, to thereby enable more uniform wafer center-to-edge temperature. The more uniform wafer temperatures provide benefits during non-steady state backside heating semiconductor manufacturing processing such as chemical vapor deposition (CVD), annealing, doping, etching, and other suitable processes to ultimately improve the performance of resulting integrated circuits, reduce manufacturing cost, cycle time, and increase production yields, when compared with traditional processes. Also, the wafer holders described herein provide for a low risk alteration to current wafer holders that can be easily implemented into current process and technology, thereby lowering cost and minimizing complexity. For example, the wafer holders described herein can be implemented into current processes without affecting the wafer processing/reaction chamber's height or base width, and without the need of additional components. Different embodiments may have different advantages, and no particular advantage is necessarily required of any embodiment.

Thus, provided is an apparatus. The exemplary apparatus includes a first portion configured to hold an overlying wafer. The first portion includes a central region and an edge region circumscribing the central region. The first portion further including an upper surface and a lower surface. The apparatus further includes a second portion extending beyond an outer radius of the wafer. The second portion including an upper surface and a lower surface. The lower surface of the first portion in the central region has a first reflective characteristic. The lower surface of the first portion in the edge region and the second portion have a second reflective characteristic.

In some embodiments, the central region has a radius within the range of from about 70 percent to about 90 percent of the outer radius of the wafer, and the first and second portions include quartz. In various embodiments, the central region is transparent, and the edge region is non-transparent. In certain embodiment, the central region is reflective, and the edge region is transparent. In further embodiments, the first reflective characteristic has a reflectance less than about 0.3. In some embodiments, the second reflective characteristic has a reflectance greater than about 0.3. In various embodiments, a thickness of the first portion is less than a thickness of the second portion. In further embodiments, the first upper surface and the first lower surface are substantially parallel one with the other, and the second upper surface and the second lower surface are substantially parallel one with the other.

Also provided is a wafer processing system. The exemplary wafer processing system includes a wafer process chamber, a wafer holder located in the wafer process chamber, a plurality of backside radiant heat elements, and at least one system coupled to the wafer process chamber and operable to perform at least wafer processing process on a wafer located on the wafer holder in the wafer process chamber. The wafer holder includes: a wafer contact portion configured to hold an overlying wafer, the wafer contact portion including a central region and an edge region circumscribing the central region; and an exterior portion extending beyond an outer radius of the wafer, wherein the central region has a radius within the range of from about 70 percent to about 90 percent of the outer radius of the wafer, wherein the central region has a first reflective characteristic, and wherein the edge region and the exterior portion have a second reflective characteristic different than the first reflective characteristic.

In some embodiments, the wafer holder includes quartz. In various embodiments, the wafer contact portion includes contact pins that are operable to support the wafer, and the contact pins include quartz. In certain embodiments, the central region is transparent, and the edge region is non-transparent. In further embodiments, the first reflective characteristic includes a reflectance less than about 0.3. In some embodiments, the second reflective characteristic includes a reflectance greater than about 0.3.

Also provided is a method. The exemplary method includes providing a wafer process chamber and a plurality of radiant heat elements under the wafer process chamber, receiving a wafer holder configured to be used in the wafer process chamber, and processing a wafer located on the wafer holder in the wafer process chamber. The processing includes using the radiant heat elements to heat the wafer. The wafer holder includes: a wafer contact portion configured to hold an overlying wafer, the wafer contact portion including a central region and an edge region circumscribing the central region; and an exterior portion extending beyond an outer radius of the wafer, wherein the central region has a radius within the range of from about 70 percent to about 90 percent of the outer radius of the wafer, wherein the central region has a first reflective characteristic, wherein the edge region and the exterior portion have a second reflective characteristic different than the first reflective characteristic, and wherein the wafer holder includes quartz.

In some embodiments, processing the wafer includes a non-steady state heating process. In various embodiments, processing the wafer includes a process selected from the group consisting of chemical vapor deposition (CVD), annealing, and etching. In certain embodiments, the central region is transparent, and the edge region is non-transparent. In further embodiments, the first reflective characteristic includes a reflectance less than about 0.3, and the first reflective characteristic is formed by depositing a reflective coating over a lower surface of the wafer contact portion in the central region. In various embodiments, the second reflective characteristic includes a reflectance greater than about 0.3, and the second reflective characteristic is formed by sanding a lower surface of the contact portion in the edge region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus comprising:
    a first portion configured to hold an overlying wafer, the first portion including a central region and an edge region circumscribing the central region, the first portion including an upper surface and a lower surface;
    a second portion including an upper surface and a single lower surface that extends beyond the wafer to an outer edge; and
    an interface region between the first portion and the second portion,
    wherein a upper surface of the interface region provides a transition from the upper surface of the first portion to the upper surface of the second portion,
    wherein the lower surface of the first portion in the edge region, a lower surface of the interface region, and the lower surface of the second portion are in a single common plane extending to the outer edge,
    wherein, the lower surface of the first portion in the central region has a first reflective characteristic,
    wherein the lower surface of the first portion in the edge region and the second portion have a second reflective characteristic different from the first reflective characteristic, and
    wherein the lower surface of the first portion in the central region includes a Heraeus Reflective Coating (HRC).

2. The apparatus of claim 1 wherein the first and second portions include quartz.

3. The apparatus of claim 1 wherein the central region is reflective, and wherein the edge region is transparent.

4. The apparatus of claim 1 wherein the second reflective characteristic has a reflectance greater than about 0.3.

5. The apparatus of claim 1 wherein a thickness of the first portion is less than a thickness of the second portion.

6. The apparatus of claim 1 wherein the first upper surface and the first lower surface are substantially parallel one with the other, and
    wherein the second upper surface and the second lower surface are substantially parallel one with the other.

7. An apparatus, comprising:
    a wafer contact portion including a central region and an edge region circumscribing the central region, only the central region including one or more features for supporting an overlying wafer; and
    an exterior portion extending beyond an outer radius of the wafer,
    wherein the central region includes a lower surface having a radius within the range from about 70 percent to about 90 percent of the outer radius of the wafer and the edge region including a lower surface having a radius within the range from about 10 percent to about 30 percent of the outer radius of the wafer, wherein the entire lower surface of the central region has a first reflective characteristic,
    wherein the edge region and the exterior portion includes a single lower surface in a single plane extending to an outer edge, wherein the lower surface of the exterior portion and the edge region has a second reflective characteristic different than the first reflective characteristic,
    wherein the wafer holder includes quartz, and
    wherein the central region is transparent and the edge region is non-transparent.

8. The apparatus of claim 7 wherein the one or more features for supporting the overlying wafer includes contact pins that are operable to support the wafer, and wherein the contact pins include quartz.

9. The apparatus of claim 7 wherein the first reflective characteristic includes a reflectance less than about 0.3.

10. The apparatus of claim 7 wherein the second reflective characteristic includes a reflectance greater than about 0.3.

11. An apparatus comprising:
    a wafer contact portion made of quartz and configured to hold a wafer, the wafer contact portion including a central region and an edge region circumscribing the central region; and
an exterior portion extending beyond an outer radius of the wafer and terminating at an outer edge,
    wherein the central region includes a lower surface extending outwardly from a center line of the wafer along the length of a radius within the range of from about 70 percent to about 90 percent of the outer radius of the wafer to the edge region, the lower surface of the central region having a first reflective characteristic, and
    wherein the edge region and the exterior portion includes a single lower surface in a single plane that extends from the lower surface of the central region to the outer edge, the lower surface of the edge region and the exterior portion having a second reflective characteristic different than the first reflective characteristic, and
    wherein the central region is transparent, and wherein the edge region is non-transparent.

12. The apparatus of claim 11 wherein wafer contact portion is configured to position the wafer proximate to a heater.

13. The apparatus of claim 12 wherein the heater is part of a process selected from the group consisting of chemical vapor deposition (CVD), annealing, and etching.

14. The apparatus of claim 11 the first reflective characteristic includes a reflectance greater than about 0.3.

15. The apparatus of claim 14 wherein the second reflective characteristic includes a reflectance less than about 0.3.

* * * * *